United States Patent [19]

Van Tuijl

[11] Patent Number: 4,607,233
[45] Date of Patent: Aug. 19, 1986

[54] PUSH-PULL AMPLIFIER CIRCUIT WITH STABLE CLASS AB OPERATION

[75] Inventor: Adrianus J. M. Van Tuijl, Nijmegen, Netherlands

[73] Assignee: U.S. Philips Corporation, New York, N.Y.

[21] Appl. No.: 706,375

[22] Filed: Feb. 27, 1985

[30] Foreign Application Priority Data

Feb. 29, 1984 [NL] Netherlands .......................... 8400634

[51] Int. Cl.[4] .............................................. H03F 3/26
[52] U.S. Cl. ..................................... 330/267; 330/255; 330/268
[58] Field of Search ............... 330/255, 267, 268, 296, 330/311, 263, 273, 274

[56] References Cited

U.S. PATENT DOCUMENTS 4,366,448 12/1982 Kosakabe et al. .................. 330/268

Primary Examiner—Eugene R. LaRoche
Assistant Examiner—Steven J. Mottola
Attorney, Agent, or Firm—Thomas A. Briody; William J. Streeter; Marianne R. Rich

[57] ABSTRACT

To obtain class AB operation of a push-pull amplifier which uses a preamplifier and an output amplifier having complementary output transistors, the base-emitter voltage of the first output transistor is converted into a current by a voltage-to-current converter and this current is re-converted into a base-emitter voltage by a current-to-voltage converter and added to the base-emitter voltage of the second output transistor. The sum of said base-emitter voltages is maintained equal to a reference voltage generated across two diode-connected transistors ($T_7$, $T_8$) by a differential amplifier.

5 Claims, 2 Drawing Figures

PUSH-PULL AMPLIFIER CIRCUIT WITH STABLE CLASS AB OPERATION

The invention relates to a push-pull amplifier comprising:

a preamplifier stage having a first and a second output, an output amplifier stage which comprises a first and a second transistor of opposite conductivity types, whose collector-emitter paths are arranged in series between two power-supply terminals and whose collectors are coupled to an output terminal, the base of the first transistor being driven by the first output and the base of the second transistor being driven by the second output of the preamplifier stage, and means for maintaining the sum of the base-emitter voltages of the first and the second transistor substantially constant, which means comprise a voltage-to-current converter comprising a third transistor, for converting the base-emitter voltage of the first transistor into a current, and a current-to-voltage converter comprising a fourth transistor identical to the third transistor, for converting the current from the voltage-to-current converter into a voltage equal to said base-emitter voltage, the base of the fourth transistor being connected to the base of the second transistor.

Such a push-pull amplifier may be used in audio-amplifier circuits, for example as described in the U.S. patent application Ser. No. 703,146 filed simultaneously with the present Application.

Such a push-pull amplifier is disclosed in U.S. Pat. No. 4,366,448, in which a small quiescent current is fed through the output transistors of opposite conductivity types so that the amplifer is operated as a class AB amplifier. The output transistors are therefore driven into partial conduction, which substantially reduces crossover distortion. For a satisfactory crossover behaviour the sum of the base-emitter voltages of the output transistors must be kept substantially constant during driving. A variation of the base-emitter voltage of the first output transistor as a result of driving of this transistor is then accompanied by an equal but opposite variation of the base-emitter voltage of the second output transistor. In the known circuit arrangement a third transistor converts the base-emitter voltage of the first output transistor into a current which is re-converted into a voltage equal to said base-emitter voltage by a fourth transistor whose base is connected to the base of the second output transistor. The voltage between the emitter and the collector of the third transistor is then equal to the sum of the base-emitter voltages of the first and the second output transistor. This voltage is applied to the base of a transistor in whose emitter circuit a diode-connected transistor is arranged. The collector current of this transistor is derived from a current source which is arranged in the common emitter line of a differential amplifier which constitutes the preamplifier. The resulting negative feedback gives rise to a specific quiescent current in the output transistors.

However, this known circuit arrangement has the disadvantage that owing to the feedback to the preamplifier a comparatively large control loop is obtained, which is likely to give rise to stability problems. Therefore, the invention aims at providing a push-pull amplifier with a stable class AB setting and in which an accurately defined quiescent current flows in the output transistors. According to the invention a push-pull amplifier of the type specified in the opening paragraph is characterized in that the means further comprise a fifth and a sixth transistor arranged as a differential pair and having a first current source arranged in the common emitter line, the base of the fifth transistor being coupled to the input of the current-voltage converter and the base of the sixth transistor being at a reference voltage which is equal to a voltage produced across two diodes by a constant current, the collectors of the fifth and the sixth transistor are each effectively loaded by one of two substantially identical current sources the sum of the currents in which is substantially equal to the current from the first current source, and the collectors of the fifth and the sixth transistor are further coupled to the bases of the first and the second transistor, respectively. In accordance with the invention the sum of the base-emitter voltages of the first and the second output transistor, which sum appears on the input of the current-to-voltage converter, is made equal to a reference voltage by means of a differential amplifier, which reference voltage is equal to the voltage across two diodes through which a specific constant current flows. Since the sum of the base-emitter voltages is equal to the reference voltage, the value of the quiescent current through the output transistors is also defined accurately. As the differential amplifier is a stage which directly precedes the output amplifier the control loop remains small, so that stability problems can be avoided.

An embodiment of the invention may be further characterized in that the emitter areas of the third and the fourth transistor are smaller than that of the first transistor. This embodiment may be characterized still further in that a resistor is arranged in the emitter line of the third and the fourth transistor. Each of these steps ensures that only a fraction of the current through the first output transistor flows through the third and the fourth transistor, so that the dissipation in these transistors remains low.

This or a further embodiment of the invention may be further characterized in that the two diodes are diode-connected transistors of opposite conductivity types. In this way the reference voltage is made subject to the same variations, for example temperature variations, as the sum of the base-emitter voltages of the first and the second transistor, so that these variations do not affect the quiescent-current setting.

These embodiments or yet another embodiment may be further characterized in that resistors are arranged in the emitter lines of the fifth and the sixth transistors. This step reduces the gain, which is favourable for the control stability.

The invention will now be described in more detail, by way of example, with reference to the accompanying drawing, in which.

Figure 1:
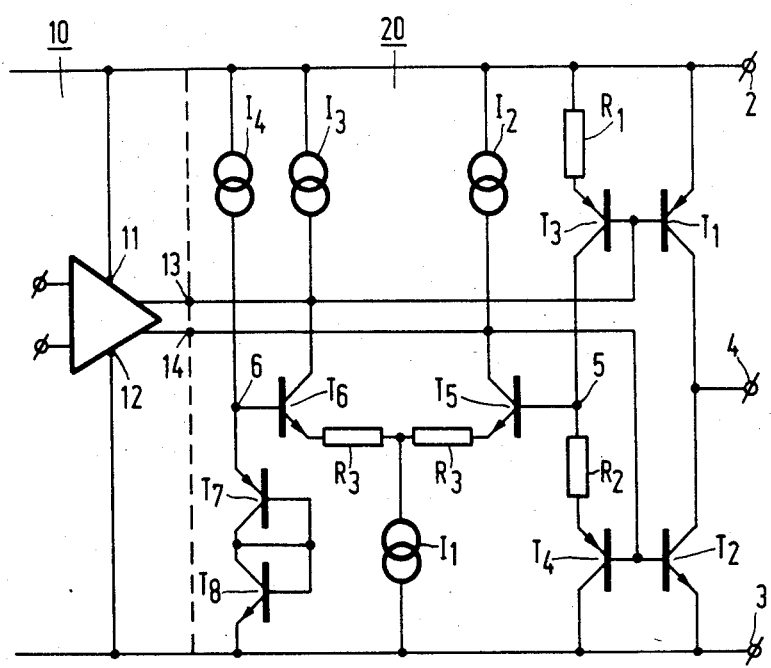
FIG. 1 shows a push-pull amplifier forming an embodiment of the invention.

FIG. 1 shows a push-pull amplifier which forms an embodiment of the invention. It comprises a preamplifier stage 10 which is shown schematically and which has supply terminals 11 and 12 connected to the positive power-supply terminal 2 and the negative power-supply terminal 3, in the present case earth respectively. The amplifier stage 10 may be of conventional design or may be constructed as described in U.S. patent application Ser. No. 703,146 which has been filed simultaneously with the present Application. The amplifier stage 10 has two outputs connected to the inputs 13 and 14 of an output-amplifier stage 20. This stage 20 comprises a PNP output transistor $T_1$ and an NPN output transistor $T_2$, whose collector-emitter paths are arranged in series between the positive and the negative power-supply terminal 2 and 3. The collectors of transistors $T_1$ and $T_2$ are connected to the output 4 of the amplifier arrangement, to which output a load may be connected. The base of transistor $T_1$ is connected to the input 13 and the base of transistor $T_2$ is connected to the input 14 of the output amplifier stage 20. A resistor $R_1$ and the base-emitter junction of a transistor $T_3$ are connected in parallel with the base-emitter junction of transistor $T_1$, the collector of said transistor $T_3$ being conncted to one end 5 of a resistor $R_2$, whose other end is connected to the emitter of a transistor $T_4$ whose base is connected to the base of transistor $T_2$ and whose collector is connected to the power-supply terminal 3. The resistor $R_2$ and the transistor $T_4$ are identical to the resistor $R_1$ and the transistor $T_3$ respectively. The output stage further comprises a differential amplifier provided with transistors $T_5$ and $T_6$, in whose emitter lines resistors $R_3$ are arranged. The common-emitter terminal is connected to the negative power-supply terminal 3 by means of a current source $I_1 = 2I$. The collector of the transistor $T_5$ is connected to the positive power-supply terminal 2 via a current source $I_2 = I$ and to the base of transistor $T_2$. Similarly, the collector of transistor $T_6$ is connected to the power-supply terminal 2 via a current source $I_3 = I$ and to the base of transistor $T_1$. The base of transistor $T_5$ is connected to the end 5 of resistor $R_2$ and the base of transistor $T_6$ is at a reference voltage equal to the sum of the base-emitter voltages of a diode-connected PNP transistor $T_7$ and a diode-connected NPN transistor $T_8$. A current from the current source $I_4$, for example a current of the value $I_4 = I/3$, flows through the transistors $T_7$, $T_8$.

The circuit arrangement operates as follows. It is assumed that the inputs 13 and 14 do not receive a drive signal and that the voltage on point 6 is higher than that on point 5. The collector current of transistor $T_6$ is then larger than I and the collector current of transistor $T_5$ is then an equal amount smaller than I. As a result of this, both the base current of transistor $T_1$ and the base current of transistor $T_2$ will increase, resulting in an increase of the base-emitter voltages of transistor $T_1$ and transistor $T_2$. Via the voltage-to-current converter $T_3$, $R_1$ the base-emitter voltage of transistor $T_1$ is converted into a current, which is re-converted into said base-emitter voltage between point 5 and the base of transistor $T_4$ by the current-to-voltage converter $R_2$, $T_4$. The base-emitter voltage of transistor $T_2$ appears between the base and the collector of transistor $T_4$. Due to the increase of the base-emitter voltages of transistors $T_1$ and $T_2$ the voltage on the base of transistor $T_5$ will also increase. In this way the voltage on point 5 is controlled so as to become equal to the voltage on point 6, a small quiescent current flowing in the transistors $T_1$ and $T_2$ so that class AB operation is obtained. In the balanced state the currents from the current sources $I_2$ and $I_3$ are wholly drained by the transistors $T_5$ and $T_6$. The base currents of the transistors $T_1$ and $T_2$ are then furnished by the preamplifier stage 10, which results in a small offset of this stage.

If for example the base current of transistor $T_1$ increases and that of transistor $T_2$ decreases when the output stage is driven, the base-emitter voltage of transistor $T_1$ will increase and the base-emitter voltage of transistor $T_2$ will decrease. If the increase of the base-emitter voltage of transistor $T_1$ is larger than the decrease of the base-emitter voltage of transistor $T_2$ the voltage on the base of transistor $T_5$ will increase relative to the voltage on the base of transistor $T_6$. This causes the base current of transistor $T_2$ and that of transistor $T_1$ to decrease, which results in a further decrease of the base-emitter voltage of transistor $T_2$ and a smaller increase of the base-emitter voltage of the transistor $T_1$. In this way the voltage on point 5 is controlled until it has become equal to the voltage on point 6, the increase of the base-emitter voltage of transistor $T_1$ then being equal to the decrease of the base-emitter voltage of transistor $T_2$. During driving large currents may flow in transistor $T_1$. The current in transistor $T_3$ should then be much smaller. For this purpose the emitter area of transistor $T_3$ is made substantially smaller than that of transistor $T_1$. For a further reduction of the currents through this transistor a resistor $R_1$ is arranged in the emitter line of transistor $T_3$ in the present embodiment. However, this resistor may be dispensed with if this further reduction is not necessary. Preferably, the reference voltage on the base of transistor $T_6$ is generated by a diode-connected PNP transistor $T_7$ and a diode-connected NPN transistor $T_8$ which are of the same type as PNP Transistor $T_1$ and NPN transistor $T_2$ respectively. This has the advantage that the characteristics of these transistors are identical, so that possible variations, such temperature variations, have the same effect on the voltages on the bases of transistors $T_5$ and $T_6$.

Figure 2:
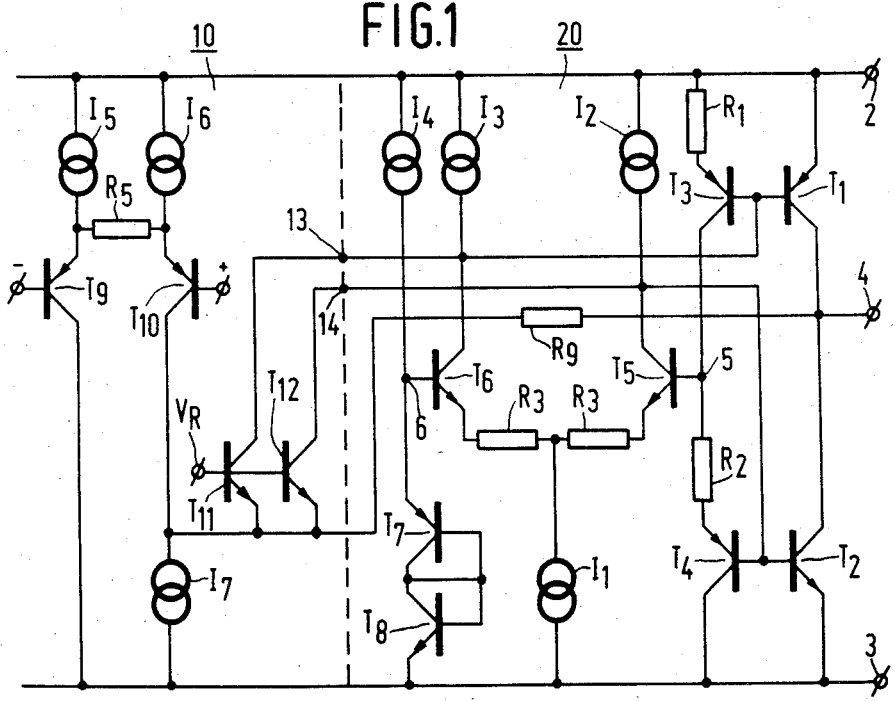
FIG. 2 shows the circuit arrangement of FIG. 1 in more detail.

As stated in the foregoing the preamplifier stage 10 may be of any conventional design. However, the push-pull amplifier shown in FIG. 2 is equipped with a new type of preamplifier which has been described comprehensively in U.S. patent application Ser. No. 703,146 filed simultaneously with the present Application. Corresponding parts bear the same reference numerals as in FIG. 1. The preamplifier 10 comprises a differential amplifier with transistors $T_9$ and $T_{10}$ whose emitters are connected to the positive power-supply terminal 2 via a current source $I_5 = I$ and a current source $I_6 = I$ respectively. Further, a resistor $R_5$ is arranged between the emitters of the transistors $T_9$ and $T_{10}$. The collector of transistor $T_9$ is connected directly to the negative power-supply terminal 3 and the collector of transistor $T_{10}$ is connected to this terminal via a current source $I_7$ supplying a current of for example $I_7 = 3.5I$. The current source $I_7$ is also connected in cascade with transistors $T_{11}$ and $T_{12}$, whose commoned bases carry a reference voltage $V_R$. This reference voltage $V_R$ is adequate to keep the current source $I_7$ operative. The collectors of the transistors $T_{11}$, $T_{12}$ are connected to the current sources $I_3$ and $I_2$ respectively, which each supply currents $2I$ and which are connected to the positive power-supply terminal 2. The collector of transistor $T_{10}$ is connected to the output 4 by a resistor $R_9$. In the quiescent state the transistors $T_5$ and $T_6$ drain half the current from the respective current source $I_2$ and the current source $I_3$. The other halves of the currents from these current sources and the current from the current source $I_6$ which flows through transistor $T_{10}$ are drained by the current source $I_7$. The residual 0.5 I required by the current source $I_7$ is furnished via the resistor $R_9$. This resistor has such a resistance value that the voltage on the output 4 is equal to half the supply voltage. If the collector current of transistor $T_{10}$ for example decreases due to the application of a difference signal between the inverting and the non-inverting input, the additional current required by the current source $I_7$ will initially cause the current through transistors $T_{11}$ and $T_{12}$ to increase, so that the base current of transistor $T_1$ increases and that of transistor $T_2$ decreases. In the manner described with reference to FIG. 1 the sum of the base-emitter voltages of transistors $T_1$ and $T_2$ is then maintained equal to the reference voltage across the diode-connected transistors $T_7$, $T_8$ by means of the differential amplifier $T_5$, $T_6$.

The invention is not limited to the embodiments shown. For example, the base-emitter voltage of transistor $T_2$ may be added to the base-emitter voltage of transistor $T_1$ via a voltage-to-current converter and a current-to-voltage converter. The remainder of the circuit may then be inverted by replacing the transistors by transistors of opposite conductivity types.

What is claimed is:

1. In a push-pull amplifier means having an output terminal, a first and second input terminal, a first and second power supply terminal, a first and a second transistor of opposite conductivity type, said first and second transistors having respective collector-emitter circuits connected in series and connected to said first and second power supply terminals, said first and second transistors further having respectively, a first and a second collector coupled to said output terminal, and respectively, a first and a second base coupled to said first and second input terminals, said push-pull amplifier means further having means for maintaining the sum of the base-emitter voltages of said first and second transistors substantially constant, said means comprising voltage-to-current converter means having a third transistor for converting said base emitter voltage of said first transistor into a first current, and current-to-voltage converter means connected to said voltage-to-current converter means for converting said first current to a first voltage equal to said base-emitter voltage of said third transistor, said current-to-voltage converter means comprising a fourth transistor substantially indentical to said third transistor, said fourth transistor having a base connected to said base of said second transistor, the improvement comprising a differential amplifier having a fifth transistor having a fifth emitter, a fifth collector, and a fifth base and a sixth transistor having a sixth emitter, a sixth collector, and a sixth base, said push-pull amplifier means further comprising a constant current source connected to said first power supply terminal, unidirectional conducting means connected between said constant current source and said second power supply terminal, a common emitter line connected to said fifth and sixth emitters, a first current source arranged in said common emitter line, a second and a third substantially identical current source furnishing a sum current substantially equal to said first current connected to respective ones of said fifth and sixth collectors, means coupling said fifth base to said current-voltage converter, means connecting said sixth base to said unidirectional conducting means, the voltage across said unidirectional conducting means constituting a reference voltage for said sixth base, and means connecting said fifth and sixth collectors to respective ones of said first and second bases.

2. A push-pull amplifier as claimed in claim 1, wherein said first, third and fourth transistor each have a respective emitter area; and wherein said emitter areas of said third and fourth transistors are smaller than said emitter area of said first transistor.

3. A push-pull amplifier as claimed in claim 1, further comprising resistance means connected to said emitters of said third and fourth transistors.

4. A push-pull amplifier as claimed in claim 1, wherein said unidirectional conducting means comprises a first diode-connected transistor and a second diode connector transistor connected in series to said first diode connector transistor, said first and second diode connector transistors being of opposite conductivity types.

5. A push-pull amplifier as claimed in 3, wherein said resistance means comprises a first resistor connected to said emitter of said third transistor and a second resistor connected to said emitter of said fourth transistor.

* * * * *